United States Patent [19]

Hutkin

[11] 4,113,576

[45] Sep. 12, 1978

[54] METHOD OF MAKING A THIN-COPPER FOIL-CARRIER COMPOSITE

[76] Inventor: Irving J. Hutkin, c/o Califoil, Inc. 7955 Arjons Dr., San Diego, Calif. 92126

[21] Appl. No.: 697,045

[22] Filed: Jun. 17, 1976

[51] Int. Cl.² .......................... C25D 1/04; C25D 1/20
[52] U.S. Cl. ......................................... 204/13; 427/32
[58] Field of Search ....................... 204/12, 13; 427/29, 427/32

[56] References Cited

U.S. PATENT DOCUMENTS

| 880,484 | 2/1908 | Edison | 204/13 |
|---|---|---|---|
| 2,433,441 | 12/1947 | Davidoff | 204/13 |
| 3,019,126 | 1/1962 | Bartholomew | 427/29 |
| 3,248,253 | 4/1966 | Barford et al. | 427/32 |
| 3,904,346 | 9/1975 | Shaw | 427/29 |
| 3,984,598 | 10/1976 | Sarazin et al. | 156/151 |
| 3,990,926 | 11/1976 | Konicek | 156/151 |

*Primary Examiner*—T. M. Tufariello

[57] ABSTRACT

The present invention is directed to an improved method of making a thin copper foil preferably about 0.5 oz. per sq. ft. or less in weight, and carrier composite by forming, as by electroplating, the thin foil on a metallic surface such as a plating belt, then contacting the exposed side of the thin foil, while it is still on that metallic surface, with fusible solid plastic particles, depositing such particles on that exposed side of the foil and coalescing them together by sufficient heat to form them into a unitary plastic sheet, but insufficient to permit the plastic to migrate through any openings in the foil onto the metallic surface. The thus formed copper foil plastic carrier sheet composite is then readily removed from the metallic surface without any damage to the foil and without plastic build-up on the metallic plating surface. The method therefore can be operated efficiently continuously over long periods of time to produce a high quality composite product suitable for a variety of uses.

19 Claims, 8 Drawing Figures

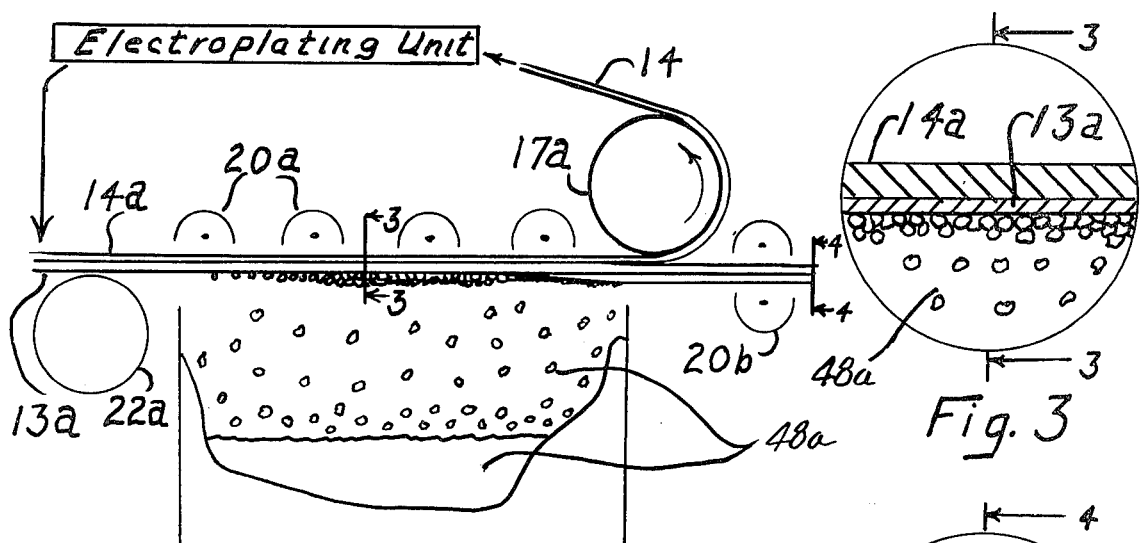
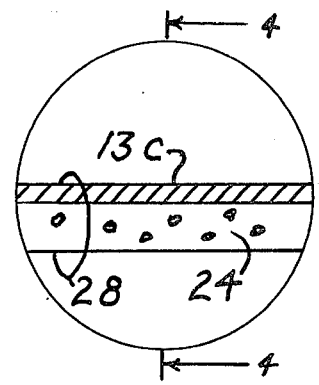
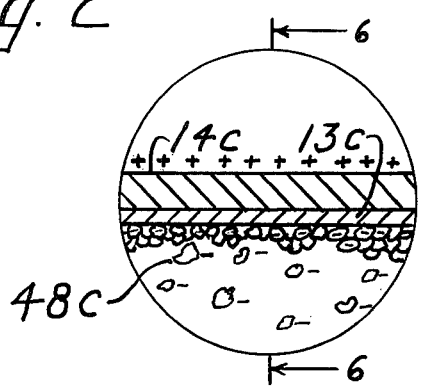
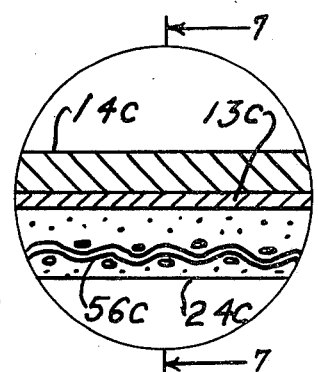
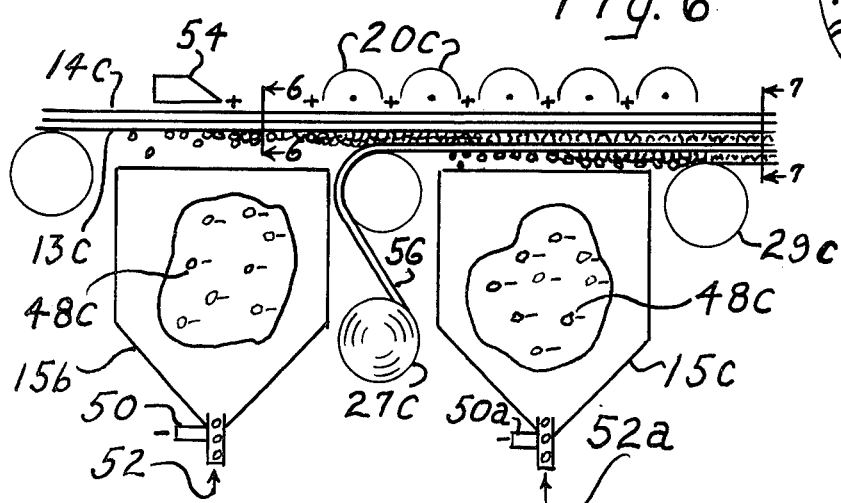

METHOD OF MAKING A THIN-COPPER FOIL-CARRIER COMPOSITE

BACKGROUND OF THE INVENTION

1. Field of the Invention

The present invention generally relates to composites and more particularly to thin copper foils supported on and bonded to improved carriers to form composites.

2. Description of Prior Art

Copper foil has been used for may years in the manufacture of printed circuits. The raw material for printed circuits usually is a laminate of copper foil and a thermosetting plastic, such as a phenolic or epoxy resin, which is often supported by paper, glass, cloth, or fibers. The supported plastic is usually applied in the uncured resinous state to the copper foil as a thick layer and is then heat and pressure cured to cause it to firmly bond to the foil. The finished laminate can have one or both exterior surfaces clad in this way with copper foil, whose thickness by weight, is usually about 1-3 oz. per sq. ft. The various methods of making printed circuits from such laminates are well known to those skilled in the art.

In recent years it has been found desirable to make laminates for printed circuits using copper foil that is much thinner than formerly. This is dictated by a new requirement that for certain applications, conducting elements be much smaller in width than previously and be spaced much closer together to facilitate circuit miniaturization. There is also a need to reduce the amount of copper removed by etching (to form the circuit conductor pattern) so as to reduce the cost of etchant and decrease etchant disposal problems.

Copper foils in thickness down to about 0.5 oz. per sq. ft. are made by electroplating the copper foil onto the surface of a slowly rotating steel drum, whose surface is specially prepared to prevent the copper layer from strongly adhering thereto. By controlling the speed of rotation of the drum and the electroplating conditions, the copper foil can be electroformed to a desired thickness. It is then peeled from the drum surface and wound onto a roll for further treatment, storage, or shipment. The surface of the foil formed away from the drum is considerably rougher than is the drum surface and is usually treated further to impart microscopic projections to it, so as to enhance its bondability to plastic during the subsequent lamination step.

When copper foil is mde in a thickness of about 0.5 oz. per sq. ft. or less, however, it becomes very difficult to handle. Thus, when it is cut into sheets and placed in the laminating press, it often wrinkles and tears unless a carrier is used to support it or unless extreme care is exercised. For ultra thin copper foils that are less than 0.5 oz. per sq. ft., the use of a thin carrier material such as a plastic film or a metal foil is often mandatory. Thus, in current practice, the desired ultra thin copper foil layer is electroformed on the surface of the foil or film carrier and may also be treated, while being supported there in order to enhance its subsequent bondability to the permanent plastic substrate in the laminating step.

Two general types of carriers are used for such purposes, those which are strongly bonded to the copper foil and those that are loosely adherent. Separation of the foil from a carrier is usually accomplished merely by peeling away the carrier, since the foil is usually only lightly attached thereto. But, when the copper foil and carrier are strongly bonded together, then their separation must usually be attained by drastic means such as by chemically dissolving the carrier away from the remaining thin copper foil.

After the copper foil is formed and treated on whatever carrier is employed, such foil and carrier are cut to the size necessary for the completed laminate. The carrier-supported foil is then assembled with the uncured, usually reinforced plastic (which is to constitute its backing) in a press, whereupon heat and pressure, for example, 200°–400° F. and 50–500 p.s.i. are applied to permanently bond the treated thin copper foil surface to the reinforced plastic base. Since the carrier is still attached to the other surface of the thin copper foil, it must then be removed either by peeling it away or by dissolving it off with chemicals, as described above.

In the case where the carrier is a plastic film, it must first be chemically prepared to receive a very thin metal layer by electroless deposition or by vacuum deposition and then the thin copper foil layer can be electroplated to the desired final thickness on the thin metal layer. The procedures required to chemically prepare the plastic for the initial metal layer, however, are intricate, time consuming, and require the use of expensive chemicals. Consequently, the use of plastic film as the carrier material is expensive and thin copper foil produced on such a carrier is quite expensive. The preparation of plastic film by vacuum deposition of metal thereon is also expensive and reliable methods for metallizing plastics without pinholes of various sizes have not yet been developed.

Because of these deficiencies, metal foil has been considered for use as the carrier. Thus, it is electrically conductive so that the metallizing step is averted. The particular foils that have been commercially used for this purpose have largely been copper. Before the thin copper foil layer can be deposited over the copper carrier, however, the surface of the copper carrier must be prepared to prevent too strong an adhesion from occurring. Various complicated procedures have been employed for this purpose, but have met with certain difficulties. One problem is that the copper carriers themselves are 2 mils or more thick and are made by electrodeposition, and thus are quite expensive. Like the plastic carriers, the high cost of thin copper foil produced on copper foil carriers has, therefore, severely restricted commercial applications.

One attempt to bypass these problems was made by Stroszynski in U.S. Pat. No. 3,660,190 dated May, 1972. This patent is directed to the production of a copper-plastic composite by roll laminating directly to the copper foil surface an adhesive and plastic layer, while the copper foil was still supported by the rotating drum or belt on which it was electroformed. However, the application of the adhesive or liquified plastic under roll pressure causes bleeding thereof through the pores invariably present in copper foil, and accordingly, the drum or belt surface would therefore become contaminated and require continuous renovation or replacement, thereby rendering the process economically unfeasible.

Accordingly, there is a need to provide an improved, inexpensive, simple and efficient method of making a very thin copper foil and plastic composite. The resulting composite should be especially quite useful in the manufacture of printed circuits and the like.

SUMMARY OF THE INVENTION

The foregoing needs have been satisfied by the method of the present invention. Thus, a thin copper foil, usually less than 0.5 oz. per sq. ft., is electroformed on a metallic surface, such as a belt or drum. While still on that surface, the exposed side of the foil has particles of fusible plastic deposited thereon and then coalesced into a unitary plastic sheet. Moreover, the coalescing is controlled so that the plastic particles during fusion do not penetrate through any holes in the foil and thereby foul the electroplating surface of the belt. The present method is rapid, inexpensive and provides high quality product. Such method is capable of being efficiently operated in a continuous, long-term mode so as to maximize product yield. Further advantages are set forth in the following detailed description and accompanying drawings.

DRAWINGS

FIG. 2 is a schematic side elevation of a second embodiment of equipment utilizable in carrying out a portion of a second mode of practicing the invention;

FIG. 3 is an enlarged, schematic cross-section of electrodeposited copper foil with plastic particles being deposited thereon as viewed along section line 3—3 of FIG. 2;

FIG. 4 is an enlarged, schematic cross-section of the metallic surface and copper foil with coalesced plastic coating thereof, as viewed along section line 4—4 of FIG. 2;

FIG. 5 is a schematic side elevation of a third embodiment of equipment utilizable in carrrying out a portion of a third mode of practicing the invention;

FIG. 6 is an enlarged schematic cross-section of electrodeposited copper foil with plastic particles being deposited thereon as viewed along section line 6—6 of FIG. 5;

FIG. 7 is an enlarged, schematic cross-section of the composite foil/plastic product with a fabric secured thereto, as viewed along section line 7—7 of FIG. 5.

DETAILED DESCRIPTION

FIGS. 1, 3, 4 and 5

Figures 1, 1A:
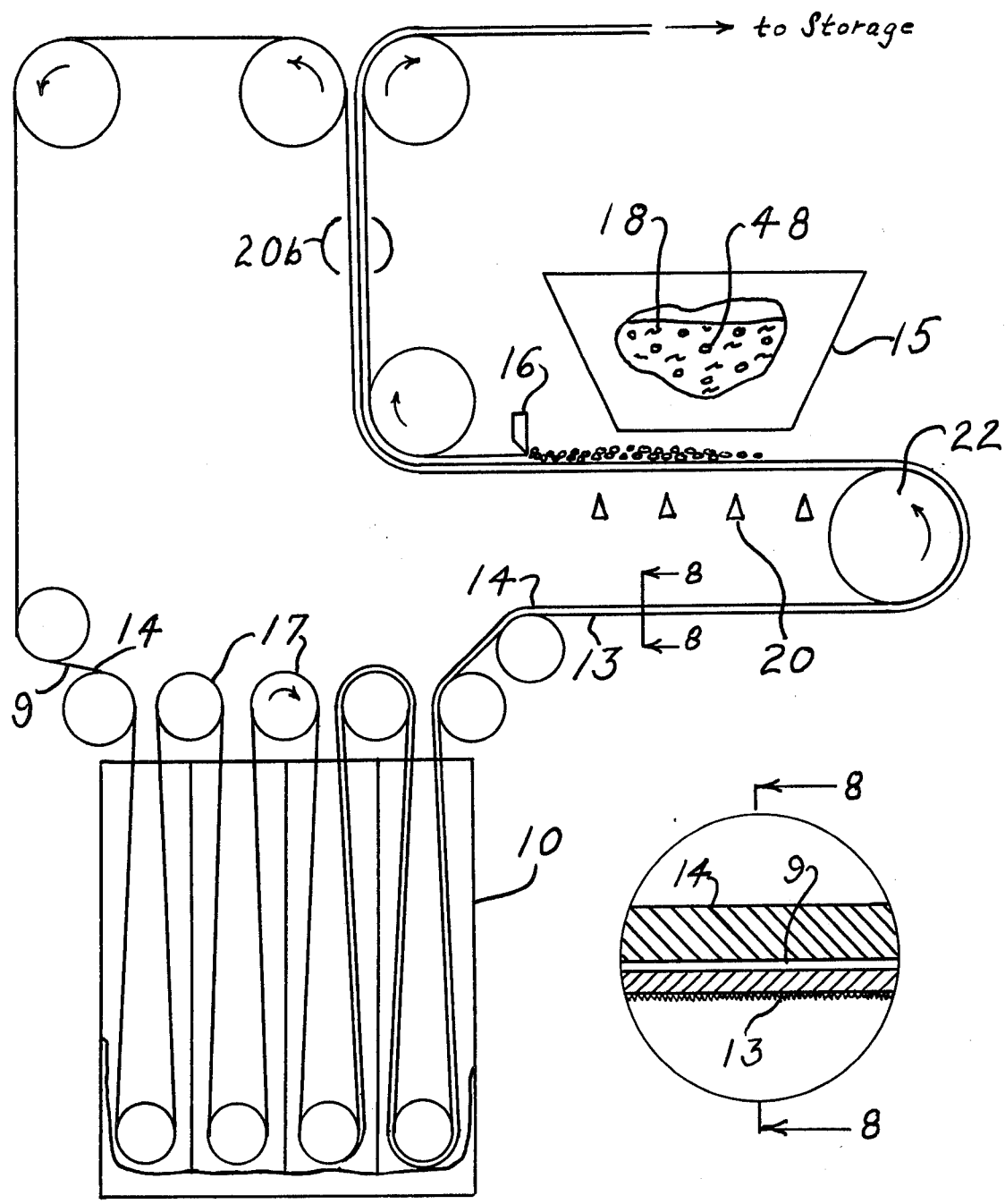
FIG. 1 is a schematic side elevation, partly broken away of a first embodiment of equipment utilizable in carrying out the invention.
FIG 1a is an enlarged, schematic cross-section of the metallic surface and copper foil taken along section line 8—8 of FIG. 1.

FIG. 1 of the drawings schematically illustrates one embodiment of equipment for carrying out the present method. Thus, the first step of the present method calls for forming a thin copper foil on a metallic surface so that the copper foil has an exposed side opposite the side which contacts the metallic surface. Such forming can be performed by any known copper deposition procedure such as vapor deposition, electroless plating or the like, but most preferably is carried out by electroplating the copper foil on a moving metallic surface, as by passing the metallic surface through an electroplating unit 10.

The preferred belt configuration would be reusable and be of stainless steel 5 to 10 mils in thickness that has been freshly plated with a layer of chromium that is 50 to 500 microinches thick. An apparatus suitable for producing the preferred configuration on a continuous loop basis is the subject of applicant's co-pending U.S. Pat. Application, Ser. No. 662,551, filed Feb. 26, 1976.

Alternately, a disposable carrier can be used with this invention, in which the disposable carrier foil such as aluminum is passed through the apparatus described herein and is retained on the surface of the copper foil as a protective layer. This protective layer is removed when processing of the copper foil surface into the final printed circuit has begun. The method of preparing the aluminum foil carrier to receive the thin copper foil layer used in this invention is also the subject of applicant's co-pending U.S. Pat. Application Ser. No. 662,551, filed Feb. 26, 1976.

Unit 10 can include the usual electroplating bath or baths, electrodes and operating parameters. For example, a typical aqueous acid copper bath (Bath A) comprising 27 oz. per gal. of copper sulfate and 10 oz. per gal. of H2SO4 can be employed at 50 a.s.f. (amps per. sq. ft.) and about 70°-100° F. over 3 minutes to about 15 minutes utilizing lead electrodes to deposit about 0.1 to about 0.5 oz. per sq. ft. of high quality copper foil 13 on a metallic belt 14 having thereon a thin, controlled metal layer 9, for example, chromium, the oxide of which is sufficiently porous to permit current transmission therethrough and which permits copper foil to be readily released therefrom. Other metals having oxide layers such as that formed on stainless steel, nickel, cobalt, etc., can also be used on suitable metal belts such as belt 14.

The bath can include small amounts of gelatin, phenyl sulfonic acid or glue to promote columnar formation of copper crystals or thiourea, molasses or dextrin to promote equiaxed formation of copper crystals. Other such baths and electroplating conditions are well known in the art.

Alternatively, unit 10 can also include a preliminary treating zone in which an initial small layer of copper is "struck" or deposited. For example, a Rochelle-tupe aqueous copper cyanide strike solution can be used at 35° C. and 25 a.s.f. to produce the "strike".

The solution (Bath X) containing:
 5.5 oz. per gal. of copper cyanide
 6.6 oz. per gal. of sodium cyanide
 4.0 oz. per gal. of sodium carbonate
 8.0 oz. per gal. of Rochelle salt (potassium sodium tartrate)

The previously described full copper electroplating is then carried out to build the copper foil to the desired thickness on the metal oxide layer on the metal substrate as belt 14 travels (from left to right on FIG. 1) along, supported on spaced rollers 17.

Since it is desirable to promote maximum adhesion between the copper foil and the plastic dielectric layer, the surface of the copper foil away from the belt is "treated" to form microscopic projections of copper and copper oxide. This done using acid copper plating baths in which the current density employed is excessive for the particular chemistry, temperature, and agitation used. The resulting deposit consists of microscopic particles of mixed copper metal and oxide adhering to the copper foil surface.

Typical "treatments" of this type are described in U.S. Pat. Nos. 3,220,897 (issued 1965) and 3,699,018 (issued 1972). Improved results are achieved in U.S. Pat. No. 3,293,109 (issued 1966) wherein a sound metallic layer of copper is deposited over the oxide-copper "treatment" to encapsulate the particles. One procedure that has been found suitable utilizes an aqueous treatment (Bath T) comprising:

6 oz. per gal. Copper Sulfate
13 oz. per gal. Sulfuric Acid

The foil is passed through this bath for approximately 30 seconds at a current density of 125 amps. per sq. ft. with little or no agitation. After rinsing, the described encapsulation is done in a bath the same as that above but with the current density of 30 amps. per sq. ft. for 2 minutes. The thin copper foil is now complete and is ready to have a plastic layer applied to form the composite for eventual manufacture of printed circuits.

The plastic layer to be applied to the "treated" copper foil surface may be any thickness from 1 mil up to 100 mils. It can be a pure resin or it may also contain filler materials. Reinforcing cut fibers of glass or fabrics may also be applied with the resin to strengthen the composite.

The resin used must be capable of being applied by conventional powder coating techniques, several of which are disclosed herein, and it must have the thermal, electrical, and chemical properties necessary for standard printed circuit fabricating procedures. Exposure to molten solder at 460° F. for 10 seconds is normally a requirement of printed circuit boards as is resistance to the chemicals normally used as copper etchants. The most commonly used resins that are employed in the manufacture of printed circuits and which are available in the powder form needed for this invention are epoxy and polyester. These are available commercially from many sources such as the Dexter Corporation, Dow Chemical, Dupont, and others. Other plastics powders available may also be used for special purpose printed circuits such as epxoy-silicone, phenolics, polypropylene, vinyls, etc. The particular choice of any one resin system is not critical to this invention. The resin particles may be of any suitable size, but preferably are very small, such as a fine powder; e.g. 100–200 standard mesh.

There are several methods for applying the powdered resin to the copper foil layer on the belt. One which works well with fiber reinforced resins is called "flock coating" (FIG. 1), in which the combined plastic powder 48 and reinforcing fibers 18 are poured through a hopper 15 onto the "treated" copper foil surface. Thickness and densification can be controlled by the speed of the belt and copper foil adhering thereto, as well as through the use of doctor blades 16 and calendering rolls (not shown). The temperature of the belt and copper foil may be raised by use of heaters 20 so that particle fusion and curing can ocurr immediately thereon, or this may be done in a separate heating zone by radiant heaters 20b through which the belt and foil pass.

An alternate and more easily controlled method is the application of plastic powder in a fluidized bed as shown in FIG. 2. In this method the copper foil 13a and belt 14a are in heaters 20a heated to the fusion temperature of the plastic and its copper surface is exposed to the fluidized or "air emulsified" powdered resin 48a. The resin 48a is kept in suspension by air jet means 66. As the powdered resin 48a contacts the heated surface it fuses thereto and its cure is started. By controlling the speed of the belt, and therefore, the amount of powder coming in contact with the heated surface, from 1 to approximately 30 mils of plastic can easily be applied. Through the use of a multiplicity of such fluidized powder zones (not shown), additional cured plastic layers can be applied over earlier ones to build to thicknesses upwards of 100 mils.

Electrostatic fluidized bed methods also may be used where subsequent fusion and curing of the powder layer is done outside the coating zone. In this method the powdered resin particles are charged electrically and adhere to the copper foil surface, which is coated completely. The charge holds the resin powder in place until heat can be applied to fuse the resin powder to the copper surface.

Electrostatic powder spraying is another method by which the resin powder can be applied, in this invention, to the copper foil surface. In this as well as the above methods it is important that the powder coating apparatus does not permit powdered resin to reach the foil edges or the back of the belt, because it may be difficult to remove. The design of the apparatus should limit the area of the copper foil exposed to the powdered resin, by shielding the foil edges from the fluidized particles. As in the first method (flock coating) further densification of the plastic coatings applied by the fluidized bed or spray methods can be accomplished after initial fusion has begun by the use of calender rolls.

As the next step in the present method, the plastic particles 48a are coalesced in place on the exposed copper surface (while foil 13 is still on moving belt 14), to form a continuous pore-free plastic layer 24 (FIG. 4), and to form the desired thin copper foil-plastic composite. The coalescing is carried out by heating particles 48a (FIG. 3) to slightly above the fusion point, thereof, so that softening of particles 48a occurs and melting of the exterior of particles 48a begins. The particles then stick together so as to form a unitary sheet 24 (FIG. 4), and curing is begun which stabilizes the form when the temperature thereof is maintained for from 2–30 minutes.

The heating can be effected by passing belt 14 over an electrical heater 20, such as is shown in FIG. 1, or equivalent means, disposed just below belt 14. Alternately, belt 14 can be heated by contact with heated rollers such as are shown at 22 in FIG. 2 or by radiant heaters 20b arranged externally. Where electrostatic fluidized bed or spraying was used to apply the powder resin layer, then the belt can be heated by passing it through an oven or heating chambers.

Heating of the belt 14 (and the plastic coated copper layer) must acomplish two purposes. First the fusion of the particles must be accomplished to achieve densification and this requires that the belt and foil be heated to a temperature at or near the melting point of the plastic powder. If the resin system is thermosetting, such as are the epoxies and some polyesters, then particle fusion takes place, followed quickly by gelling of the resin. In some plastic compositions further curing is required to maximize properties but this can often be done at lower temperatures. A typical epoxy powder would fuse and gel in 20 seconds at 410° F. and require further curing at 325° F. for 4 mintues. In many cases the postcuring of the resin can be done after the copper-plastic composite has been separated from belt 14 and is rolled or coiled since the plastic layer has already "set" or hardened.

If the plastic layer to be applied is thermoplastic such as some polyesters, vinyls, and polypropylene, then the belt and copper foil are preheated to slightly above the fusion temperature before being sprayed or passed through the fluidized bed. In the fusion of thermoplastic powders it is important that fusion and coalescense of the particles take place without significant overheating that could cause the melted layer to flow or "run". One consequence would be penetration into pinholes in the copper foil and difficulty in subsequent cleaning of the belt for replating.

Further in accordance with the present method, the foil-plastic of FIG. 4 so produced after passing roller 17a, FIG. 2, is then separated from belt 14 and separately recovered as on a take-up reel or the like (not shown). FIG. 4 schematically illustrates finished composite 28 with plastic sheet 24 adhering to and supporting the foil 13c so that it can be readily processed, shaped, and otherwise treated in the manufacture of miniaturized circuit boards and to the like. Accordingly, present method has substantial advantages over the art which make it more rapid, efficient, and inexpensive. Certain further features of the method are illustrated in the following specific example.

One method of coating the copper foil and carrier with resin by an electrostatic fluid bed is set forth in FIG. 5. In this method bins 15b and 15c are provided which are adapted to contain electrostatically charged resin particles 48c. The particles 48c receive a negative electrostatic charge from charging devices 50 and 50a. Particles 48c are introduced into containers 15b and 15c through underside ports 52 and 52a. A positive electrostatic charge is applied to the copper foil 13c by charge device 54. As the positively charged copper foil 13c passes over container 15b, the negatively charged resin prticles 48c are attached to and carried by copper foil 13c aong to and under heaters 20c which melts the resin particles 48c and causes fusion thereof to copper foil 13c.

If desired, the resin coated composite can have a loosely woven glass fabric 56 laid against the underside of the resin layer and then be passed over container 15c to have resin deposited thereover in the manner described immediately heretofore to produce a further reinforced composite product.

EXAMPLE A

The electroplating unit of FIG. 1 is employed to continuously produce a thin copper foil-plastic composite. The belt 14 employed is stainless steel 5 to 10 mils thick, with a chromium layer 9 about 0.5 mils thick thereon. Power driven rollers 17 move the belt through the various treating stages carried out in the apparatus of FIG. 1. Thus, the belt with its chromium surface 9 in place passes first into a portion of the electroplating unit wherein Bath X (previously described) is employed at 25 a.s.f. and 35° C. with a copper anode to produce a copper "flash" thereon, after which the "flash", which is about 0.1 mils thick, is water washed. The belt then travels into the main electroplating part of unit 10 wherein electroplating of copper on the "flash" is carried out using Bath A (previously described), 50 a.s.f. copper anodes and 70° F., for about 7 minutes, until the thickness of the copper foil so produced is about 0.3 oz. per sq. ft. The foil is then water washed, and passed into the "treater" section of the electroplating unit. Here the copper foil and belt are passed through the treatment Bath T for 30 seconds at 125 a.s.f. followed by 2 minutes at 30 a.s.f. in the same bath.

The foil and belt are rinsed, dried, and moved to an apparatus such as shown on FIG. 2. There it is passed over heating rollers 22a and under radiant heaters 20a that raise the belt 14a and foil 13a temperature to 200° C. whereupon it is passed over a fluidized bed of DRI-KOTE epoxy powder No. DK4-03 (48a) manufactured by Hysol Division of the Dexter Corporation. An epoxy layer of approximately 5 to 10 mils fuses to the foil which traverses the fluid powder area in approximately 1 minute. Heating of the epoxy and copper layers is maintained by radiant heaters 20a for an additional 2 minutes to completely cure the epoxy layer. The copper foil 13a with its epoxy layer 24 are separated from belt 14a, which is returned to the electroplating apparatus to be replated. The epoxy coated copper foil composite can be cut into flat sections and stacked for storage or else it can be rolled (uncut) into a coil for storage.

EXAMPLE B

The belt and "treated" copper foil are prepared in the same method as described in Example A above. The "treated" copper surface is then passed over an apparatus as shown in FIG. 5, having the capability to deposit plastic powder with electrostatic charge (electrostatic fluidized bed or electrostatic spraying). The apparatus is charged with DRI-KOTE Flexible Epoxy Powder DK1, manufactured by Hysol Division of the Dexter Corporation. As the copper foil traverses Section 1 of the apparatus, charged epoxy powder 48c adheres to the cold, treated copper surface 13c, FIG. 6. As it passes from Section 1 to Section 2, FIG. 5, a loosely woven glass fabric 56 is fed from a storage roll 27c to a position contacting the powder coated foil from Section 1. As the foil 13c powder 48c and glass fabric 56 travel together into Section 2 heat is applied by heaters 20c to cause fusion to begin. As plastic layer 24c fuses and bonds to both copper layer 13c and glass layer 56c, additional powder is deposited on the opposite side of glass layer 56c which melts and fuses thereto (FIG. 7). Teflon coated calendering rolls 29c at the outlet of Section 2 causes complete densification and encapsulation of the glass reinforced epoxy-copper composite. It should be noted that this apparatus could be made redundant to apply in sequence, several layers of glass and epoxy powders.

EXAMPLE C

The belt and "treated" copper foil are prepared in the same manner as shown in Example A above. A thin layer of epoxy powder is applied to the "treated" copper surface by the electrostatic fluidized bed procedure, which is the preferred method for applying a thin, pore-free layer of plastic. A sound epoxy layer of 1 to 2 mils thick is at least partially cured in this procedure and possesses sufficient strength to support the thin copper foil when it is peeled away from the stainless belt. The thin copper foil with its epoxy coating now supporting it, is removed from the belt and the epoxy surface of the composite (epoxy and copper) can be laminated to additional epoxy and glass layers by conventional hot pressing (static) techniques. Alternatively, the epoxy surface of the composite can be roll laminated to a plastic film such as a polymide or a polyester. In either procedure, the thin cured epoxy layer on the foil supports the foil during subsequent handling and also prevents resin bleed-thru in the pores of the thin copper foil. The chromium layer on the belt is not in any way fouled by the plastic and thus is reusable for continued copper electroplating thereon. The method can be run in a continuous mode if desired, by periodically stripping off and regenerating the chromium layer. In any event, the resulting composite can be provided easily, rapidly and simply by the present method.

When, in separate parallel tests, polypropylene, polystyrene, and acrylic resins are substituted for the thermosetting plastics, similar results are otained. Such is also the case when the chromium oxide on the belt is changed to nickel oxide, stainless steel oxide, or cobalt oxide and when the belt itself is changed to nickel, brass, copper, mild steel, aluminum, or stainless steel. In one test, the "strike" is dropped without adverse effects.

Accordingly, the present method can be carried out in various modes to provide the desired composite in an improved manner. Various modifications and changes in the method, its steps and parameters can be effected. All such modifications and changes as are within the scope of the appended claims form a part of the present invention.

What is claimed is:

1. An improved method of making a thin copper foil-plastic composite, said method comprising:
   a. forming a thin copper foil on a permanent metallic surface, said foil having an exposed side opposite the side thereof which contacts said metallic surface;
   b. contacting only said exposed foil side, while said foil is still on said surface, with a plurality of fusible solid plastic particles and depositing said particles only on said exposed side;
   c. coalescing said plastic particles into a unitary foil-plastic composite sheet while preventing bleed-through of said plastic through any pinholes in said foil to said metallic surface; and
   d. readily removing said composite from said metallic surface without rupturing said foil and without plastic buildup on said metallic surface, whereby the side of the foil which contacted the metallic surface is substantially free of any of said plastic.

2. The improved method of claim 1 wherein said forming is effected by electroplating said copper foil.

3. The improved method of claim 2 wherein said metallic surface comprises plateable metallic oxide which permits release of said copper foil therefrom but which facilitates formation of high quality foil.

4. The improved method of claim 1 wherein said plastic particles comprise thermoplastic powder.

5. The improved method of claim 4 wherein said contacting of said plastic powder with said exposed foil side is carried out while the temperature of said exposed foil side is above the fusion point of said powder so as to effect said coalescing of said powder into said unitary sheet, but which temperature is below that which facilitates migration of said plastic through any openings in said foil to said metallic surface.

6. The improved method of claim 4 wherein said plastic powder bears an induced opposite electrical charge to that of said exposed foil side so that said contacting is effected as a result of charge attraction.

7. The improved method of claim 5 wherein said metallic surface comprises plateable metallic oxide which permits release of said copper foil therefrom but which facilitates formation of high quality foil.

8. The improved method of claim 6 wherein said forming is effected by electroplating said copper foil to a thickness of less than about 0.5 oz. per sq. ft.

9. The improved method of claim 8 wherein said metallic surface comprises plateable metallic oxide which permits release of said copper foil therefrom but which facilitates formation of high quality pore-free foil.

10. The improved method of claim 1 imcluding the step of treating said exposed foil side to provide it with a plurality of copper and/or copper oxide nodules, prior to exposing the foil to said particles.

11. The improved method of claim 1 wherein said plastic particles are selected from the group of epoxy, polyester, epoxy-silicone, phenolic, polypropylene, vinyl or like thermosetting resins.

12. The improved method of claim 1 including the steps of positioning one side of at least one layer of a fabric reinforcement in contact with the solid plastic particles, and then contacting the opposite side of said layer with solid plastic particles prior to coalescing said plastic particles.

13. A composite product comprising:
   a. a metallic surface;
   b. a substantially pore-free, thin copper foil on said metallic surface; and,
   c. an in situ-formed plastic coating adherent by itself to one side of said copper foil but not bleeding through said copper foil to contact said metallic surface, whereby the side of the foil contacting the metallic surface is substantially free of any of said plastic.

14. The composite product set forth in claim 13 wherein said metallic surface comprises a plateable metallic oxide which permits ready release of said copper foil therefrom but which facilitates formation of high quality, substantially pore-free copper foil.

15. The composite product set forth in claim 14 wherein said plastic coating comprises a fused thermoplastic powder.

16. The composite product of claim 15 including a fabric layer secured to the freeside of said plastic coating.

17. The composite product of claim 16 including a second plastic coating secured to the freeside of said fabric layer.

18. The composite product of claim 17 including a plurality of fabric layers and platic coating layers.

19. The composite product of claim 13 wherein said metallic surface comprises an expendable member such as aluminum or brass which permits release of said copper foil therefrom but which facilitates formation of high quality, pore-free foil.

* * * * *